(12) United States Patent
Lai et al.

(10) Patent No.: US 10,068,991 B1
(45) Date of Patent: Sep. 4, 2018

(54) PATTERNED SIDEWALL SMOOTHING USING A PRE-SMOOTHED INVERTED TONE PATTERN

(71) Applicant: International Business Machines Corporation, Armonk, NY (US)

(72) Inventors: Kafai Lai, Poughkeepsie, NY (US); Hari V. Mallela, Poughquag, NY (US); Hiroyuki Miyazoe, White Plains, NY (US); Reinaldo A. Vega, Mahopac, NY (US); Rajasekhar Venigalla, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/438,383

(22) Filed: Feb. 21, 2017

(51) Int. Cl.
*H01L 21/331* (2006.01)
*H01L 29/66* (2006.01)
*H01L 29/78* (2006.01)
*H01L 21/308* (2006.01)
*H01L 29/161* (2006.01)

(52) U.S. Cl.
CPC .... *H01L 29/66795* (2013.01); *H01L 21/3086* (2013.01); *H01L 29/161* (2013.01); *H01L 29/785* (2013.01)

(58) Field of Classification Search
CPC .......... H01L 29/66795; H01L 21/3086; H01L 29/161; H01L 29/785; H01L 21/0628; H01L 21/027; H01L 21/0337; H01L 27/0886; H01L 27/10826; H01L 27/1211; H01L 21/0465

USPC ........ 257/288, 368, 369, 435; 438/377, 445, 438/712, 942
See application file for complete search history.

(56) References Cited

U.S. PATENT DOCUMENTS

| | | | |
|---|---|---|---|
| 5,795,784 A * | 8/1998 | Arnquist | G01N 35/0092 422/63 |
| 6,838,347 B1 | 1/2005 | Liu et al. | |
| 7,459,363 B2 | 12/2008 | Subramanian | |
| 8,268,729 B2 | 9/2012 | Cheng et al. | |
| 8,329,585 B2 | 12/2012 | Sheu et al. | |
| 8,497,213 B2 | 7/2013 | Yasui et al. | |
| 8,975,189 B2 | 3/2015 | Lu et al. | |
| 9,159,581 B2 | 10/2015 | Li et al. | |
| 9,406,530 B2 | 8/2016 | Cohen et al. | |

(Continued)

OTHER PUBLICATIONS

Lee et al., "Thermal Annealing in Hydrogen for 3-D Profile Transformation on Silicon-on-Insulator and Sidewall Roughness Reduction", Journal of Microelectromechanical Systems, vol. 15, No. 2, Apr. 2006, pp. 38-343.

(Continued)

*Primary Examiner* — Shahed Ahmed
(74) *Attorney, Agent, or Firm* — Cantor Colburn LLP; Vazken Alexanian

(57) ABSTRACT

Embodiments are directed to a method and resulting structures for smoothing the sidewall roughness of a post-etched film. A sacrificial layer is formed on a substrate. A patterned mask is formed by removing portions of the sacrificial layer to expose a surface of the substrate. The sidewalls of the patterned mask are smoothed and a target layer is formed over the patterned mask and the substrate. Portions of the target layer are removed to expose a surface of the patterned mask and the patterned mask is removed.

15 Claims, 10 Drawing Sheets

(56) References Cited

U.S. PATENT DOCUMENTS

| | | | |
|---|---|---|---|
| 2007/0015371 A1* | 1/2007 | Olynick | ............ H01L 21/30655 |
| | | | 438/712 |
| 2009/0174036 A1 | 7/2009 | Fuller et al. | |
| 2012/0064463 A1 | 3/2012 | Park et al. | |
| 2012/0238097 A1 | 9/2012 | Huang et al. | |
| 2016/0064239 A1 | 3/2016 | Shih et al. | |
| 2016/0315014 A1* | 10/2016 | Chou | ................ H01L 21/82348 |

OTHER PUBLICATIONS

Pham et al., "Fabrication and Characterization of Smooth Si Mold for Hot Embossing Process", IEEJ Transactions on Sensors and Micromachines, vol. 127, No. 3, Mar. 2007, pp. 187-191.

Sparacin et al., "Silicon Waveguide Sidewall Smoothing by Wet Chemical Oxidation", Journal of Lightwave Technology, vol. 23, No. 8, Aug. 2005, pp. 2455-2461.

Kafai Lai et al., "Patterned Sidewall Smoothing Using a Pre-Smoothed Inverted Tone Pattern", Related Application, U.S. Appl. No. 15/875,619, filed Jan. 19, 2018.

List of IBM Patents or Patent Applications Treated As Related; (Appendix P), Filed Jan. 22, 2018; pp. 1-2.

\* cited by examiner

PATTERNED SIDEWALL SMOOTHING USING A PRE-SMOOTHED INVERTED TONE PATTERN

BACKGROUND

The present invention relates in general to semiconductor and optoelectronic device fabrication methods and resulting structures. More specifically, the present invention relates to fabrication methods and resulting structures for smoothing the sidewall roughness of a post-etched film.

In contemporary semiconductor device fabrication processes a large number of microelectronic and on-chip photonics devices, such as field effect transistors (FETs) and semiconductor optical waveguides, respectively, are fabricated on a single wafer. FETs are well known in the electronic arts and form the basis of modern integrated circuit design, logic, and memory applications. Semiconductor optical waveguides, on the other hand, are a very important part of modern integrated optoelectronic systems, especially for electrically active devices. Applications range from semiconductor lasers, optical filters, switches, modulators, isolators, and photodetectors. To increase device density, improve performance, and decrease the power load of these devices, device fabricators employ increasingly sophisticated fabrication techniques that include a combination of lithography, sidewall image transfer, spacer imaging and other processes to form final device structures having progressively decreasing critical dimensions.

SUMMARY

According to one or more embodiments of the present invention, a method for smoothing the sidewall roughness of a post-etched film is provided. The method includes forming a sacrificial layer on a substrate. A patterned mask is formed by removing portions of the sacrificial layer to expose a surface of the substrate. The sidewalls of the patterned mask are smoothed, and a target layer is formed over the patterned mask and the substrate. Portions of the target layer are removed to expose a surface of the patterned mask, and the patterned mask is removed.

According to one or more embodiments of the present invention, a method for smoothing the sidewall roughness of a post-etched film is provided. The method includes forming a sacrificial layer on a substrate. A patterned mask is formed by removing portions of the sacrificial layer to expose a surface of the substrate. Sidewalls of the patterned mask are smoothed, and a semiconductor layer is formed over the patterned mask and the substrate. A semiconductor fin is formed by removing portions of the semiconductor layer to expose a surface of the patterned mask. The patterned mask is removed, and a gate is formed over a channel region of the semiconductor fin.

According to one or more embodiments of the present invention, a semiconductor device having smoothed sidewalls is provided. The structure includes a semiconductor fin formed on a substrate and a gate formed over a channel region of the semiconductor fin. Each sidewall of the semiconductor fin includes a one sigma root-mean-square (RMS) roughness of less than about 10 atomic layers, or less than about 3 nanometers (nm).

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
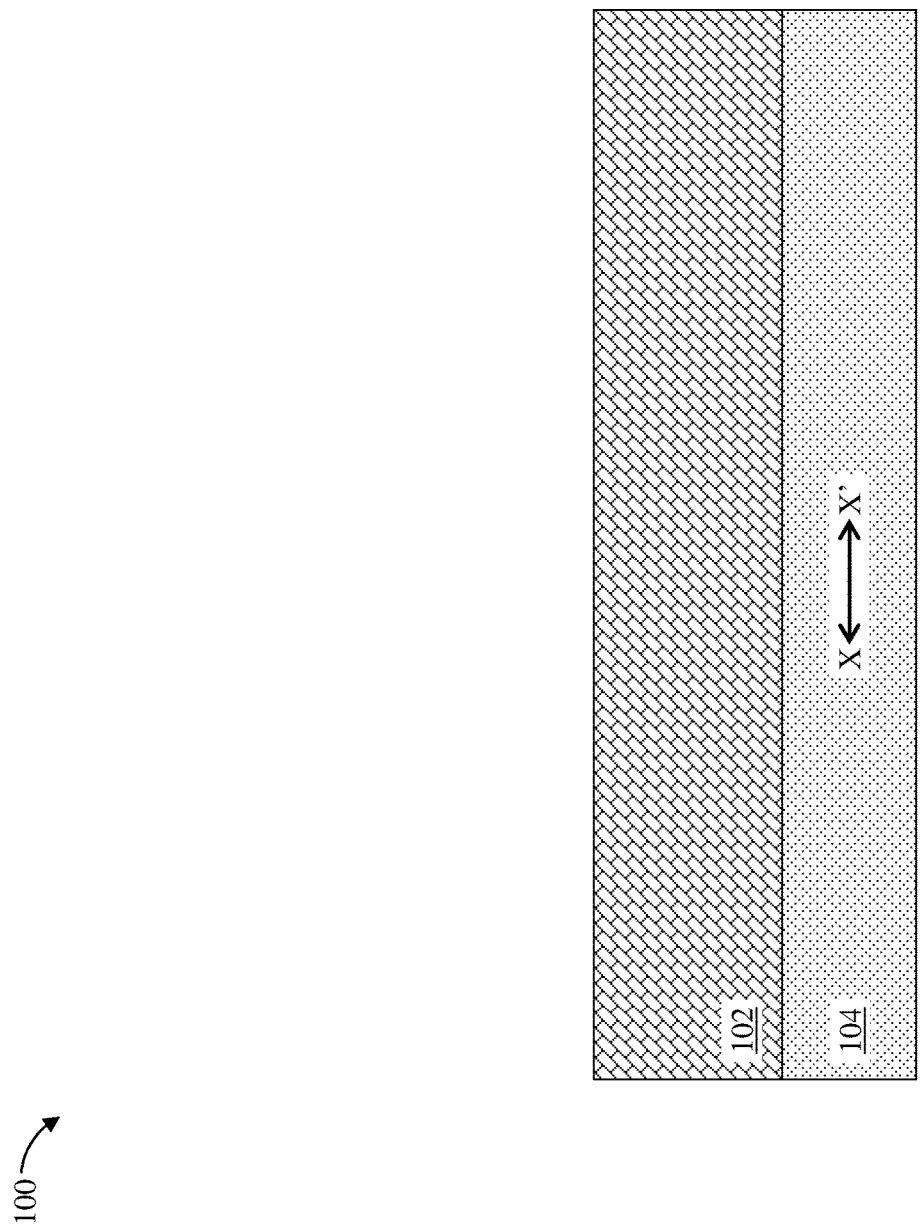
FIG. 1 depicts a cross-sectional view of a structure having a sacrificial layer formed on a substrate during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. The term "selective to," such as, for example, "a first element selective to a second element," means that a first element can be etched and the second element can act as an etch stop. The term "conformal" (e.g., a conformal layer) means that the thickness of the layer is substantially the same on all surfaces, or that the thickness variation is less than 15% of the nominal thickness of the layer.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. A reactive ion etch (RIE), for example, is a type of dry etch that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present invention, as previously noted herein, device fabricators rely on an increasingly sophisticated combination of lithography, sidewall image transfer, spacer imaging and other processes to form microelectronic and on-chip photonics device structures having progressively smaller critical dimensions. There are challenges, however, in scaling these devices beyond the 10 nm node. As semiconductor device critical dimensions continuously scale downward, sidewall surface smoothness at relevant scales becomes increasingly difficult to achieve. The vertical walls of conventional non-planar finFETs, for example, are ideally smooth on an atomic scale with a consistent fin width. Sidewall variations (also known as sidewall roughness) can degrade gate insulator integrity and reduce charge carrier mobility. Sidewall roughness similarly impedes photonics devices, causing light scattering and negatively impacting mode efficiencies, resonator fitness, extinction ratios, modulator bandwidth, and insertion loss.

Conventional fabrication processes for these devices typically result in a one sigma root-mean-square (RMS) sidewall surface roughness of a few nanometers (typically greater than about 10 atomic layers, or about 3 nm). Accordingly, various approaches have been explored for reducing or effectively eliminating sidewall roughness. Current sidewall surface smoothing techniques are limited, however, to high temperature processes (e.g., high temperature $H_2$ annealing and hot silicon mold embossing) that are poorly suited to temperature-sensitive applications and materials. Hot embossing techniques are further limited in that these processes require the removal of the final polymer structure from the mold which introduces frictional forces that can break or distort the structure. While post-passivation processes can somewhat mitigate frictional coefficients, these techniques are generally limited to the formation of polymer patterns.

Turning now to an overview of the aspects of the present invention, one or more embodiments provide methods for smoothing the sidewall roughness of a post-etched film. An inverted image structure (also known as a sacrificial film) is formed on a substrate using a wet etch, a dry etch, or a combination of sequential wet or dry etches. Known sidewall surface smoothing techniques are then applied to the inverted image structure (i.e., post-etch smoothing). A target layer is formed over the patterned mask and the substrate. The target layer is planarized to a surface of the patterned mask and the patterned mask is removed. In this manner, the target layer is decoupled from the actual smoothing process (i.e., the sidewall smoothness of the patterned mask is effectively transferred to the target layer). Consequently, the use of conventional high temperature sidewall smoothing processes are restricted to the inverted image structure and subsequent processing of the target layer can be accomplished at a much lower temperature—allowing the process to be used in temperature-sensitive applications and with materials unavailable to prior art methods. Moreover, separating the target layer from the sacrificial film using a selective etch eliminates the introduction of frictional forces and allows for the process to be applied to a wide range of polymers, inorganic films, and non-polymer structures.

Example methods for smoothing the sidewall roughness of a post-etched film and the resulting structures therefrom in accordance with embodiments of the present invention are described in detail below by referring to the accompanying drawings in FIGS. 1-10.

Figure 5:
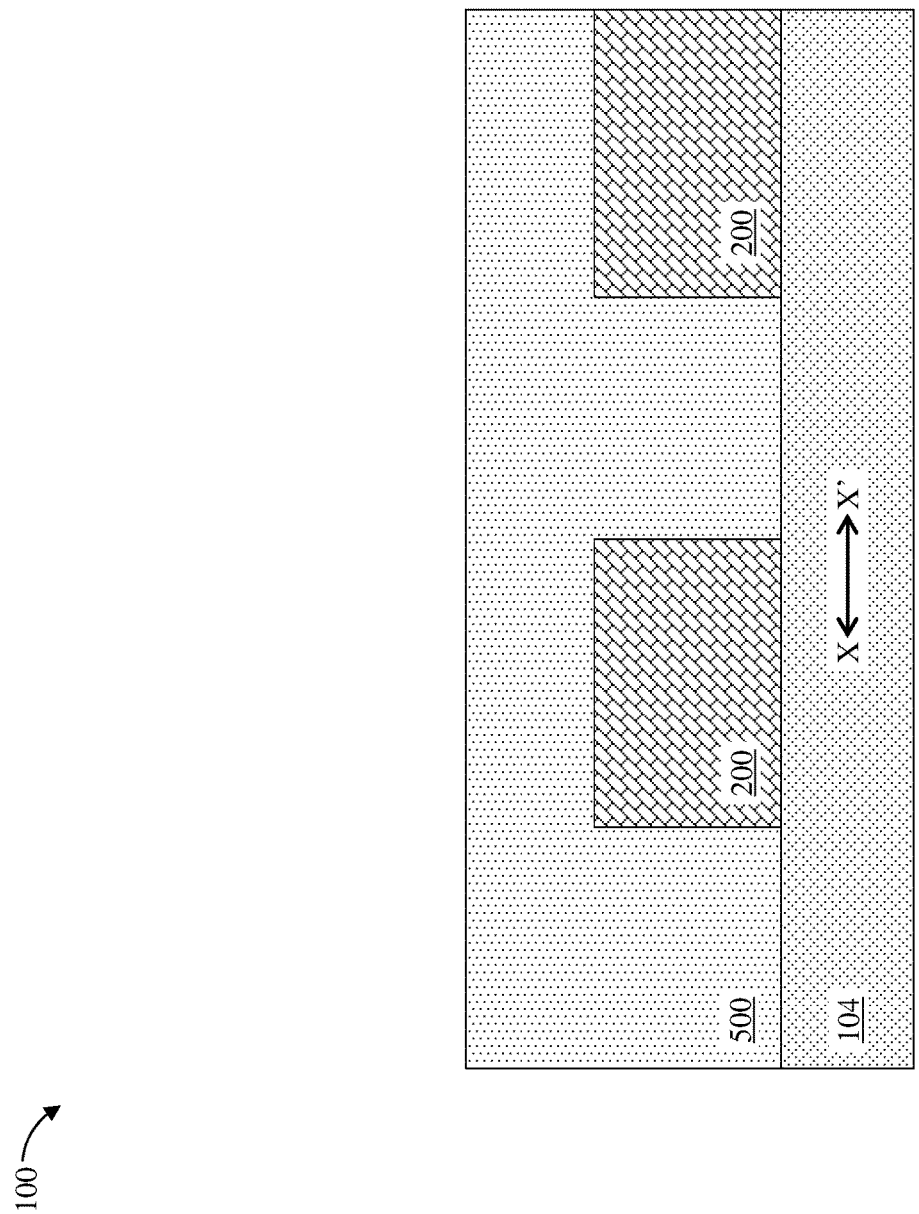
FIG. 5 depicts a cross-sectional view of the structure after forming a target layer over the patterned mask and the substrate during an intermediate operation of a method of fabricating a semiconductor device according to one or more embodiments of the present invention.

FIG. 1 illustrates a cross-sectional view of a structure 100 having a sacrificial layer 102 formed on a substrate 104 during an intermediate operation of a method of fabricating a semiconductor device according to one or more embodiments. In some embodiments, the sacrificial layer 102 is formed using a CVD, PECVD, ALD, PVD, chemical solution deposition, or other like process in combination with a wet or dry etch process. In some embodiments, the sacrificial layer 102 has a thickness of about 2 nm to about 50 nm, or about 4 nm to about 50 nm, although other thicknesses are within the contemplated scope of the invention. The sacrificial layer 102 can be made of any suitable material capable of being removed selective to the target structure 600 (as depicted in FIG. 5), such as, for example, a nitride, silicon nitride (SiN), or silicoboron carbonitride (SiBCN). In some embodiments, the sacrificial layer 102 is a hard mask layer, such as, for example, silicon dioxide ($SiO_2$), silicon oxynitride (SiON), or silicon oxygen carbonitride (SiOCN).

In some embodiments, the sacrificial layer 102 is an epitaxially grown film, such as, for example, monocrystalline silicon (Si), germanium (Ge), or silicon germanium (SiGe). In some embodiments, the epitaxially grown films are formed from gaseous or liquid precursors. In some embodiments, epitaxial regions are epitaxially grown over the substrate 104.

The terms "epitaxial growth", "epitaxial deposition" and/or "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed non-semiconductor surfaces, such as silicon dioxide or silicon nitride surfaces.

Epitaxial semiconductor materials can be grown using vapor-phase epitaxy (VPE), MBE, liquid-phase epitaxy (LPE), or other suitable processes. In some embodiments, the gas source for the deposition of epitaxial semiconductor material includes a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

The substrate 104 can be made of any suitable substrate material, such as, for example, monocrystalline Si, SiGe, SiC, III-V compound semiconductor, II-VI compound semiconductor, or semiconductor-on-insulator (SOI). Group III-V compound semiconductor materials include materials having at least one group III element and at least one group V element, such as, for example, one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys. Group II-VI compound semiconductor materials include Group II elements selected from zinc, cadmium, the alkaline earth metals (such as beryllium, magnesium calcium, strontium, and barium, and mixtures thereof), and Group VI elements selected from oxygen, sulfur, selenium, tellurium, and mixtures thereof. Group II-VI semiconductor compounds can be doped with one or more p-type dopant, such as, but not limited to, nitrogen, phosphorus, arsenic, antimony, bismuth, copper, chalcogenides of the foregoing, and mixtures thereof. In some embodiments, the substrate 104 includes a buried oxide layer (not depicted). In some embodiments, the substrate 104 includes both an nFET region and a pFET region. In some embodiments, the substrate 104 includes either an nFET region or a pFET region.

Figure 2:
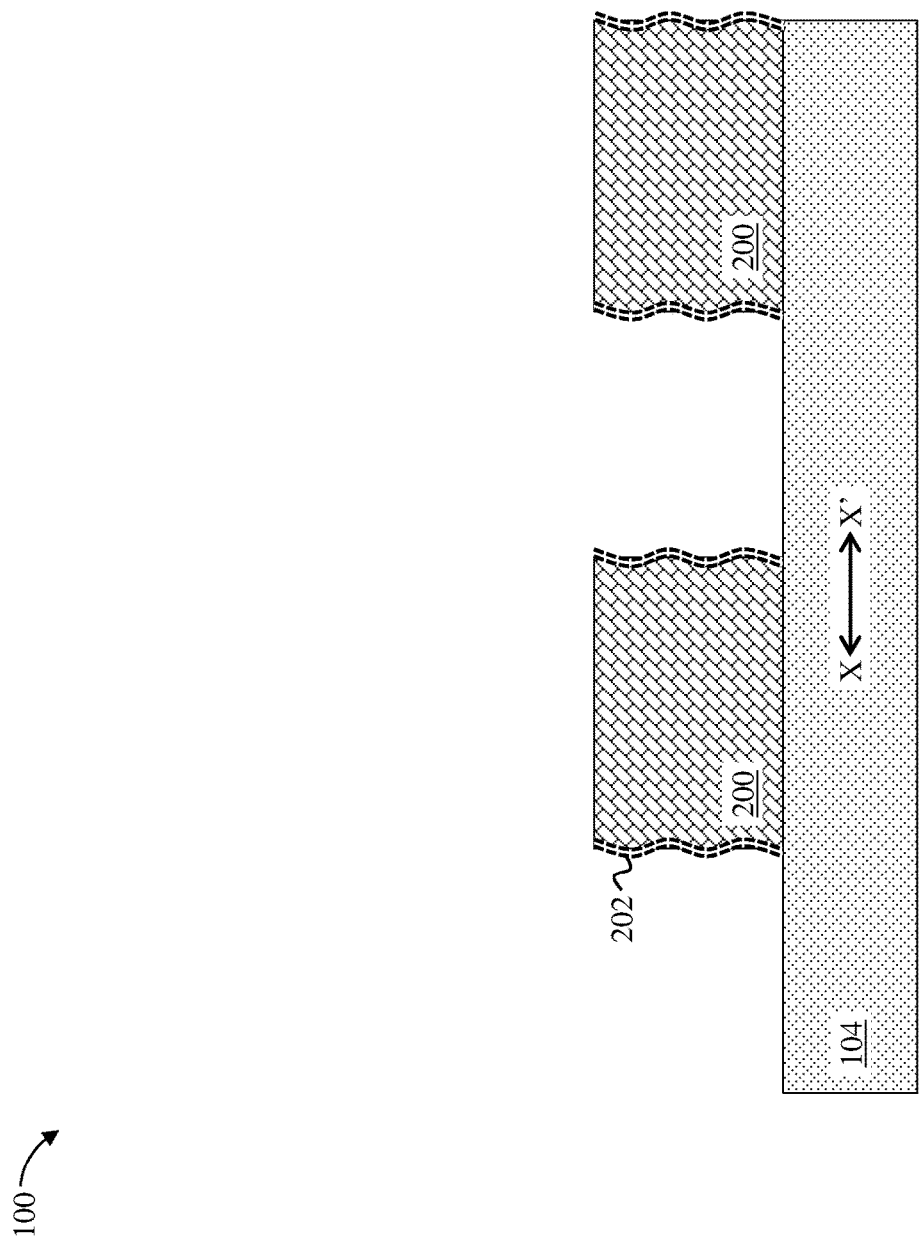
FIG. 2 depicts a cross-sectional view of the structure after patterning the sacrificial layer to form a patterned mask during an intermediate operation of a method of fabricating a semiconductor device according to one or more embodiments of the present invention.

FIG. 2 illustrates a cross-sectional view of the structure 100 after patterning the sacrificial layer 102 to form a patterned mask 200 during an intermediate operation of a method of fabricating a semiconductor device according to one or more embodiments. The patterned mask 200 is an inverted image of the target structure 600 (as depicted in FIG. 5). The sacrificial layer 102 can be patterned using known processes, such as, for example, lithography or wet or dry etching. In some embodiments, the sacrificial layer 102 is patterned using a RIE selective to the substrate 104. The patterning process results in a rough surface 202 on the sidewalls of the patterned mask 200 (i.e., the rough surface 202 can have a 1 sigma RMS roughness of greater than about 10 atomic layers, or greater than about 3 nm).

Figure 3:
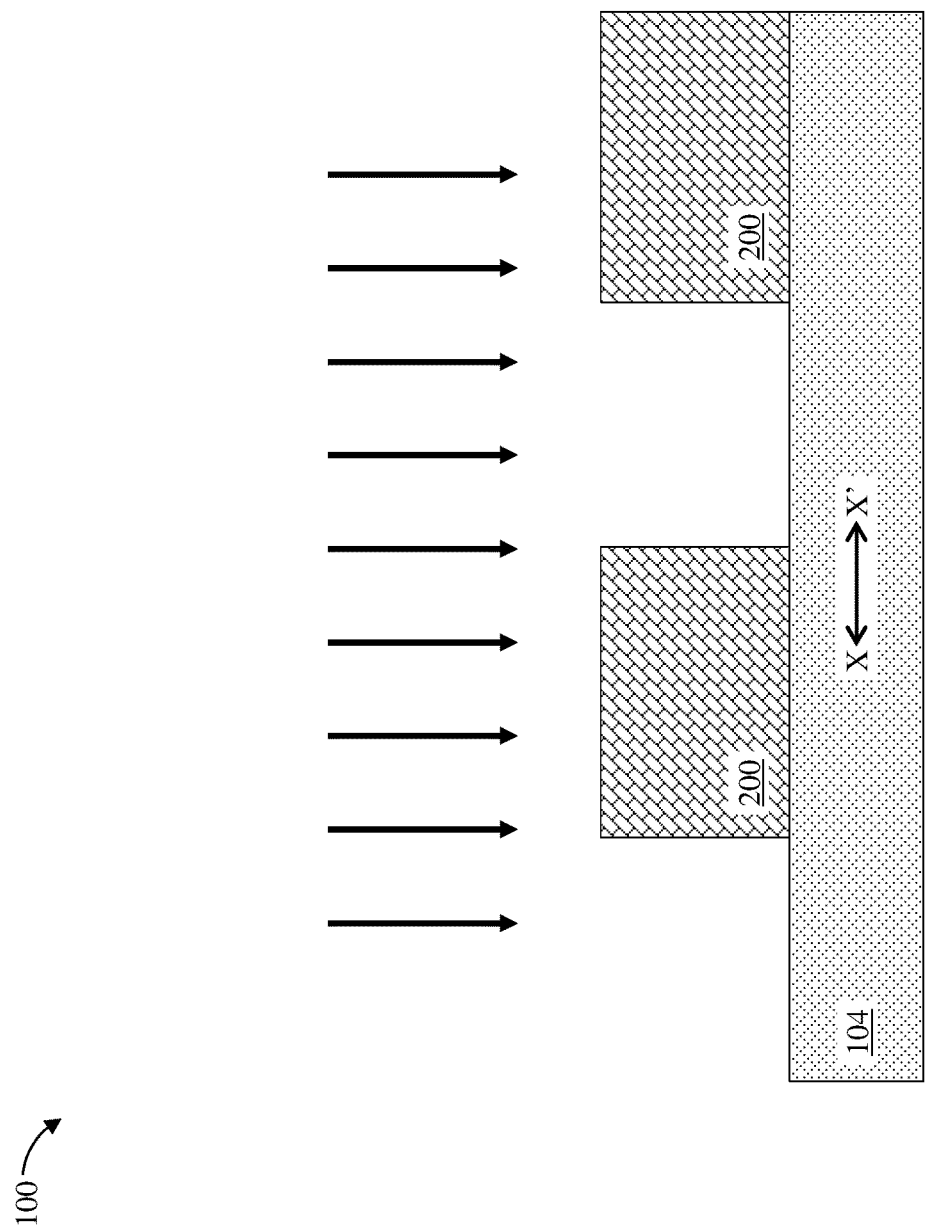
FIG. 3 depicts a cross-sectional view of the structure after smoothing the sidewalls of the patterned mask during an intermediate operation of a method of fabricating a semiconductor device according to one or more embodiments of the present invention.

FIG. 3 illustrates a cross-sectional view of the structure 100 after smoothing the sidewalls (i.e., removing the rough surface 202) of the patterned mask 200 during an intermediate operation of a method of fabricating a semiconductor device according to one or more embodiments. Any known manner for smoothing the sidewalls of a film or polymer can be used, such as, for example, high temperature $H_2$ furnace annealing or hot mold embossing. The smoothing processes (e.g., a high temperature anneal at a temperature of greater than about 500 degrees Celsius, or greater than about 800 degrees Celsius) induces surface migration along the sidewalls of the patterned mask 200, reducing high frequency roughness. Consequently, a 1 sigma RMS roughness of the sidewalls of the smoothed patterned mask 200 of less than about 10 atomic layers, or less than about 3 nm, or less than about 3 atomic layers, or less than about 1 nm, can be achieved.

Figure 4:
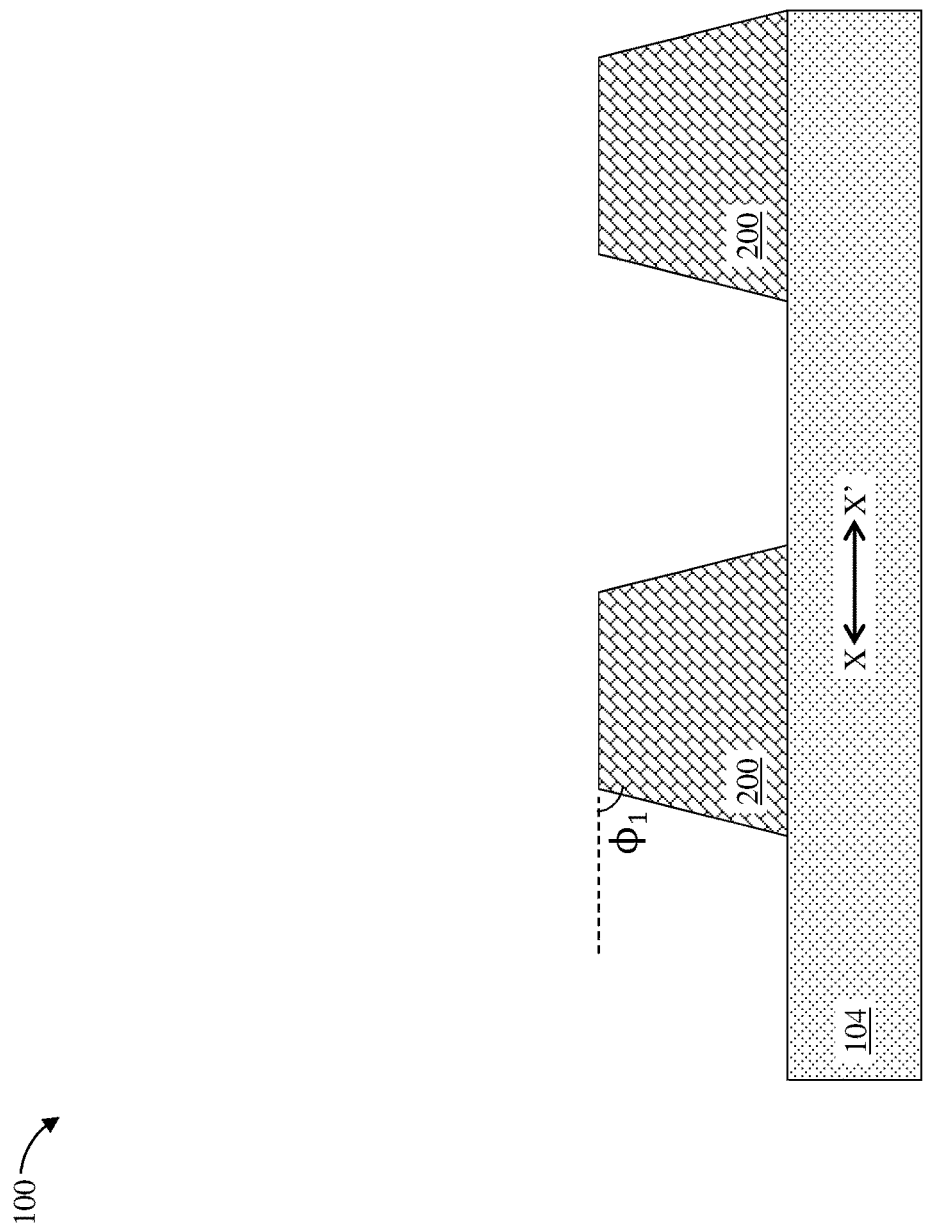
FIG. 4 depicts a cross-sectional view of the structure after smoothing the sidewalls of the patterned mask causes the sidewalls of the patterned mask to become tapered during an intermediate operation of a method of fabricating a semiconductor device according to one or more embodiments of the present invention.

In some embodiments, smoothing the sidewalls of the patterned mask 200 causes the sidewalls of the patterned mask 200 to become tapered and the sidewall angle $\phi_1$, as depicted in FIG. 4, can be less than about 90 degrees. The sidewall angle $\phi_1$ is measured from the horizontal plane (i.e., the top surface of the patterned mask 200).

FIG. 5 illustrates a cross-sectional view of the structure 100 after forming a target layer 500 over the patterned mask 200 and the substrate 104 during an intermediate operation of a method of fabricating a semiconductor device according to one or more embodiments. The target layer 500 can be formed using any known process, such as, for example, CVD, PECVD, ALD, PVD, chemical solution deposition, or other like process. The target layer 500 can be made of any suitable material, such as, for example, semiconductor materials, photonics materials, polymers, and non-polymers (e.g., monocrystalline Si, SiGe, SiC, III-V compound semiconductor, II-VI compound semiconductor, poly methyl methacrylate (PMMA), InP, or other suitable materials). In some embodiments, the target layer 500 is overfilled, forming an overburden above a surface of the patterned mask 200.

Figure 6:
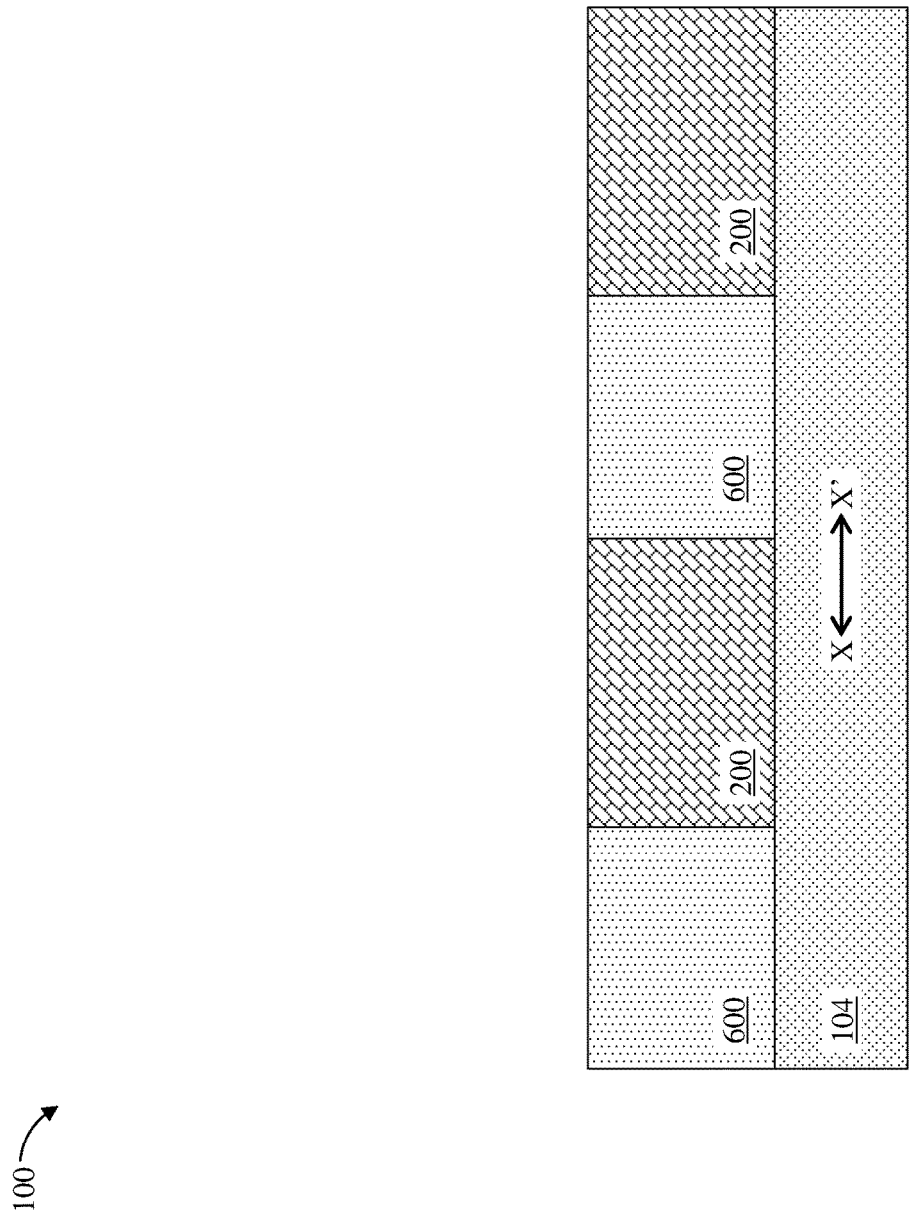
FIG. 6 depicts a cross-sectional view of the structure after removing portions (i.e., the overburden) of the target layer to form a target structure over the substrate during an intermediate operation of a method of fabricating a semiconductor device according to one or more embodiments of the present invention.

FIG. 6 illustrates a cross-sectional view of the structure 100 after removing portions (i.e., the overburden) of the target layer 500 to form a target structure 600 over the substrate 104 during an intermediate operation of a method of fabricating a semiconductor device according to one or more embodiments. In some embodiments, a CMP selective to the patterned mask 200 removes the target layer 500 overburden and exposes a top surface of the patterned mask 200. In other embodiments, portions of the target layer 500 are removed and a top surface of the patterned mask 200 is exposed using a wet etch, a dry etch, or a combination of sequential wet or dry etches. In some embodiments, the wet or dry etches are selective to the patterned mask 200.

Figure 7:
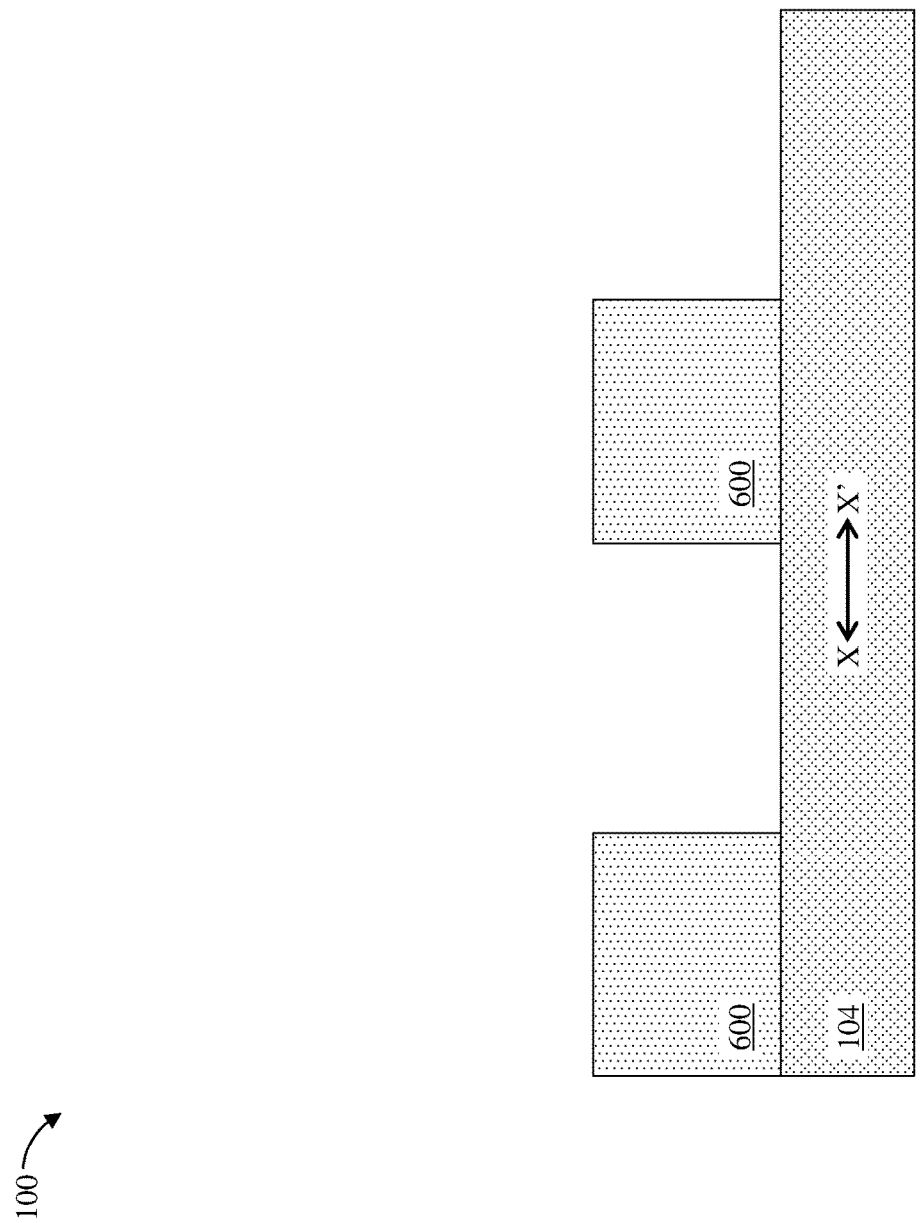
FIG. 7 depicts a cross-sectional view of the structure after selectively removing the patterned mask from the substrate during an intermediate operation of a method of fabricating a semiconductor device according to one or more embodiments of the present invention.

FIG. 7 illustrates a cross-sectional view of the structure 100 after selectively removing the patterned mask 200 from the substrate 104 during an intermediate operation of a method of fabricating a semiconductor device according to one or more embodiments. As discussed previously herein, the patterned mask 200 is made of a material chosen such that the patterned mask 200 can be removed selective to the target structure 600. In this manner, the 1 sigma RMS roughness of the sidewalls of the target structure 600 of less than about 10 atomic layers, or less than about 3 nm, or less than about 3 atomic layers, or less than about 1 nm can be achieved. The patterned mask 200 can be removed using any suitably selective process, such as, for example, a wet etch selective to the target structure 600. In some embodiments, the patterned mask 200 is removed using a hydrochloric acid (HCl) etch, which can include a mixture of hydrochloric acid, hydrogen peroxide ($H_2O_2$), sulfuric acid ($H_2SO_4$), and water.

Figure 8:
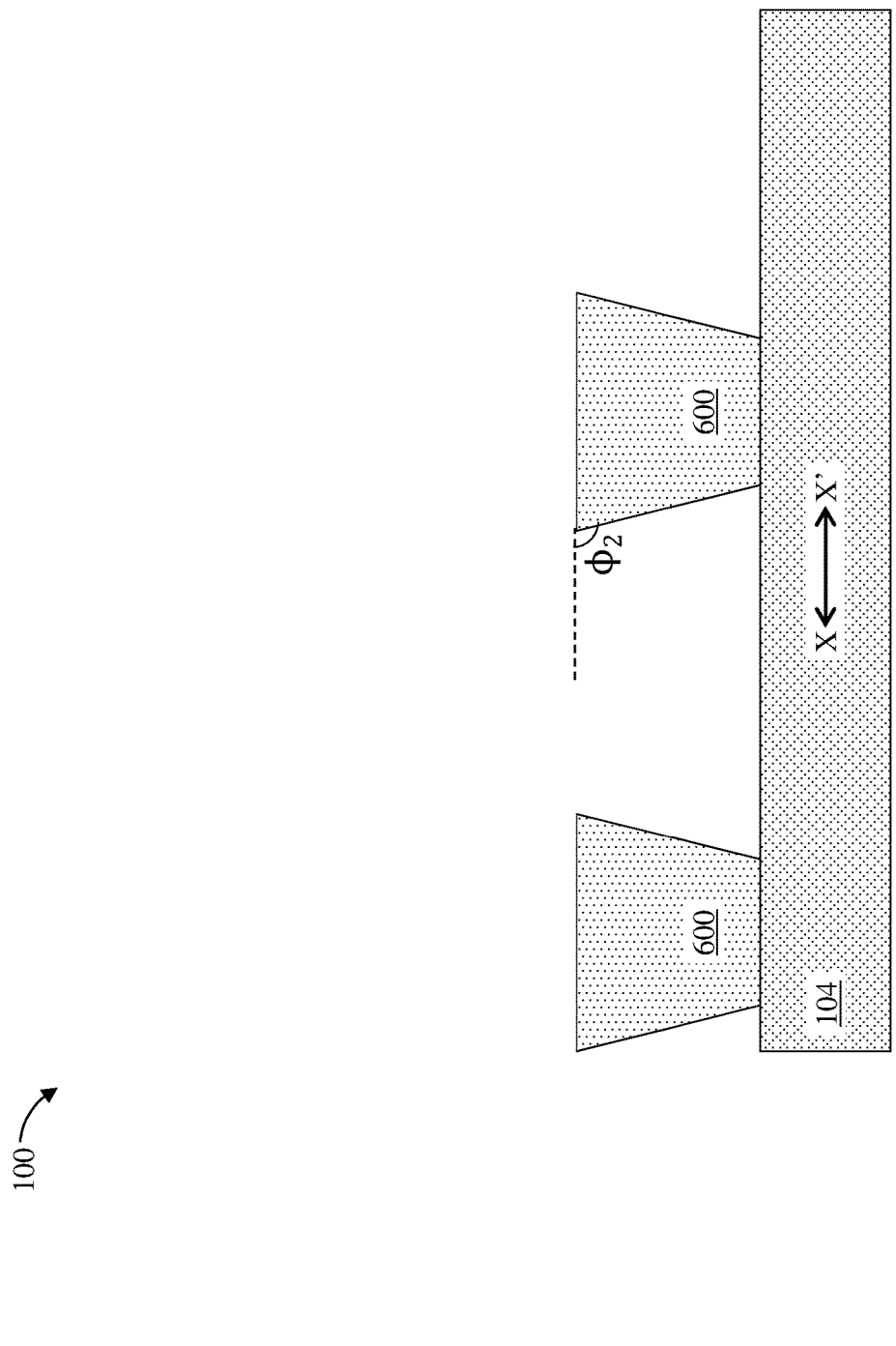
FIG. 8 depicts a cross-sectional view of the structure having tapered sidewalls during an intermediate operation of a method of fabricating a semiconductor device according to one or more embodiments of the present invention.

In embodiments where smoothing the sidewalls of the patterned mask 200 causes the sidewalls of the patterned mask 200 to become tapered, as depicted in FIG. 4, the sidewall angle $\phi_2$ of the target structure 600 will be greater than about 90 degrees (i.e., the sidewall angle $\phi_2$ of the target structure 600 will be 180 degrees$-\phi_1$), as depicted in FIG. 8. The sidewall angle $\phi_2$ is measured from the horizontal plane (i.e., the top surface of the target structure 600).

Figure 9:
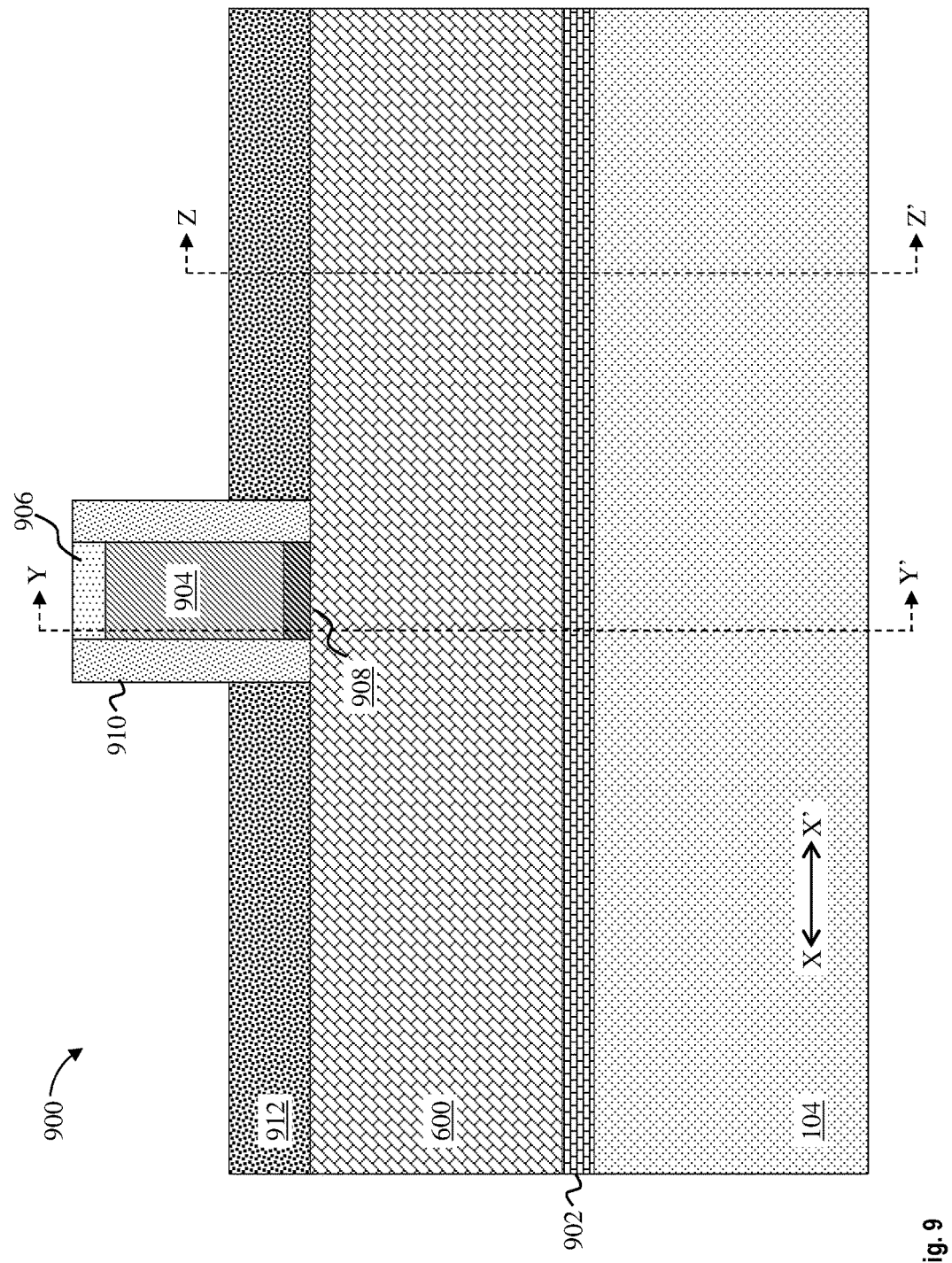
FIG. 9 depicts a cross-sectional view of a structure along a direction X-X' (parallel to fin direction) after forming a semiconductor fin on a substrate during an intermediate operation of a method of fabricating a semiconductor device according to one or more embodiments of the present invention.

FIG. 9 illustrates a cross-sectional view of a structure 900 along a direction X-X' (parallel to fin direction) after forming the target structure 600 (here referred to as a semiconductor fin 600) on the substrate 104 during an intermediate operation of a method of fabricating a finFET semiconductor device according to one or more embodiments of the present invention. In some embodiments, the target structure 600 is a semiconductor fin formed on the substrate 104 during an intermediate operation of a method of fabricating a finFET semiconductor device according to one or more embodiments of the present invention. In some embodiments, a semiconductor buffer layer 902 is formed between the semiconductor fin 600 and the substrate 104. The semiconductor buffer layer 902 can be made of any suitable material, such as, for example, Si, SiGe, III-V compound semiconductor material, or other suitable materials. In embodiments where the target structure 600 is an InGaAs semiconductor fin and the substrate 104 is made of InP, for example, the semiconductor buffer layer 902 can be made of indium aluminum arsenide (InAlAs).

A sacrificial gate 904 is formed over channel regions of the semiconductor fin 600. Any known method for patterning a sacrificial gate (also known as a dummy gate) can be used, such as, for example, a wet etch, a dry etch, or a combination of sequential wet and/or dry etches. For example, in some embodiments, a layer of a-Si is etched using a patterned hard mask (not depicted). In some embodiments, hard mask 906 is formed on the sacrificial gate 904. The hard mask 906 can be made of any suitable material, such as, for example, a silicon nitride, silicon dioxide, SiON, SiC, SiOCN, or SiBCN. In some embodiments, a thin silicon oxide film (not depicted) is formed between the hard mask 906 and the sacrificial gate 904.

The sacrificial gate 904 can be replaced with a conductive gate (not depicted) using known finFET processes. The conductive gate can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

In some embodiments, a high-k dielectric 908 is formed between the conductive gate after replacing the sacrificial gate 904) and the semiconductor fin 600. In some embodiments, the high-k dielectric 908 modifies the work function of the gate. The high-k dielectric 908 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectric 908 can have a thickness of about 0.5 nm to about 4 nm, or about 2 nm to about 3 nm, although other thicknesses are within the contemplated scope of the invention.

In some embodiments, work function layers (not depicted) are formed between the high-k dielectric 908 and the conductive gate. The work function layers can be made of work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments, the work function layers further modify the work function of the gate.

In some embodiments, spacers 910 are formed on sidewalls of the sacrificial gate 904 and on surfaces of the semiconductor fin 600. In some embodiments, the spacers 910 are formed using a CVD, PECVD, ALD, PVD, chemical solution deposition, or other like process in combination with a wet or dry etch process. The spacers 910 can be made of any suitable material, such as, for example, a low-k dielectric, a nitride, silicon nitride, silicon dioxide, SiON, SiC, SiOCN, or SiBCN.

Doped regions 912 are formed on the semiconductor fin 600. The doped regions 912 can be source or drain regions formed in the substrate 104 by a variety of methods, such as, for example, in-situ doped epitaxy, doped following the epitaxy, or by implantation and plasma doping. In some embodiments, the doped regions 912 are complementary, such that one of the doped regions is a source while the other is a drain. The doped regions 912 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments, the doped regions 912 include epitaxial semiconductor materials grown from gaseous or liquid precursors. In some embodiments, epitaxial regions are epitaxially grown over the substrate 104 and/or the semiconductor fin 600. Epitaxial semiconductor materials can be grown using vapor-phase epitaxy (VPE), MBE, liquid-phase epitaxy (LPE), or other suitable processes. The doped regions 912 can be doped during deposition (in-situ doped) by adding dopants, n-type dopants (e.g., phosphorus or arsenic) or p-type dopants (e.g., Ga, B, $BF_2$, or Al). The dopant concentration in the doped regions 912 can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

The doped regions 912 can be made of any suitable material, such as, for example, Si, SiGe, III-V compound semiconductor, or other suitable materials. In some embodiments, the doped regions 912 are raised source/drain regions formed from III-V compound semiconductor material. In some embodiments, the gas source for the deposition of epitaxial semiconductor material includes a silicon, a germanium, or a III-V compound semiconductor containing gas source, or a combination thereof. For example, an epitaxial InGaAs layer can be deposited from a gas source that is selected from the group consisting of arsine, trimethyl indium, and trimethyl gallium. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the doped regions 912 include silicon. In some embodiments, the doped regions 912 include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Conductive contacts (gate contacts and source/drain contacts, not depicted) can be formed or deposited using known finFET metallization techniques. In some embodiments, an interlayer dielectric (ILD, not depicted) is patterned with open trenches and the contacts are deposited into the trenches. In some embodiments, the contacts are overfilled into the trenches, forming overburdens above a surface of the ILD. In some embodiments, a CMP selective to the ILD removes the overburden. The contacts can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the contacts can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

Figure 10:
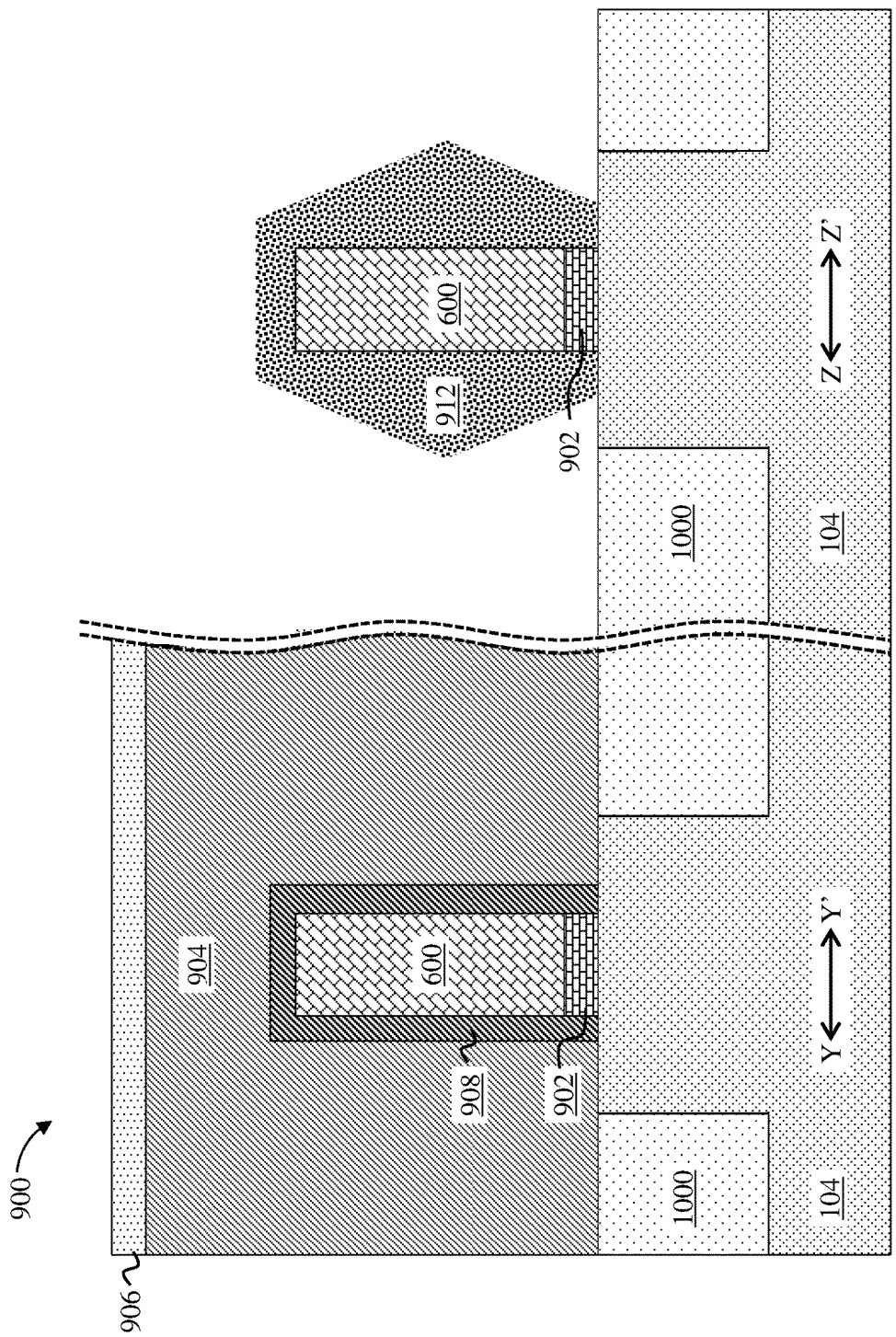
FIG. 10 depicts a cross-sectional view of the structure of FIG. 9 along the lines Y-Y' (fin cross section under gate) and Z-Z' (fin cross section under source/drain) during an intermediate operation of a method of fabricating a semiconductor device according to one or more embodiments of the present invention.

FIG. 10 illustrates a cross-sectional view of the structure 900 along the lines Y-Y' (fin cross section under gate) and Z-Z' (fin cross section under source/drain) of FIG. 9 during an intermediate operation of a method of fabricating a semiconductor device according to one or more embodiments of the present invention. In some embodiments, a dielectric layer 1000 is formed on a surface of the substrate 104. The dielectric layer 1000 can be made of any suitable dielectric material, such as, for example, porous silicates, carbon doped oxides, silicon dioxide, silicon nitrides, silicon oxynitrides, or other dielectric materials. Any known manner of forming the dielectric layer 1000 can be utilized. The dielectric layer 1000 can be formed using, for example, CVD, PECVD, ALD, flowable CVD, spin-on dielectrics, or PVD. In some embodiments, the dielectric layer 1000 is a shallow trench isolation (STI) region. The STI region prevents electrical current leak between adjacent semiconductor device components.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
    forming a sacrificial layer on a substrate;
    forming a patterned mask by removing portions of the sacrificial layer to expose a surface of the substrate, thereby forming one or more cavities in the sacrificial layer at one or more locations where the surface of the substrate is exposed;
    smoothing sidewalls of the patterned mask;
    forming a target layer over the patterned mask and the substrate, such that the target layer completely fills in the one or more cavities;
    removing portions of the target layer to expose a surface of the patterned mask; and
    removing the patterned mask.

2. The method of claim 1, wherein after smoothing the sidewalls of the patterned mask each sidewall of the patterned mask comprises a one sigma root-mean-square (RMS) roughness of less than about 10 atomic layers, or less than about 3 nm.

3. The method of claim 1, wherein after smoothing the sidewalls of the patterned mask each sidewall of the patterned mask comprises a one sigma root-mean-square (RMS) roughness of less than about 3 atomic layers, or less than about 1 nm.

4. The method of claim 1, wherein smoothing sidewalls of the patterned mask comprises a high temperature furnace annealing or a hot mold embossing process at a temperature of greater than about 500 degrees Celsius.

5. The method of claim 1, wherein after removing the patterned mask each sidewall of the target layer comprises a one sigma root-mean-square (RMS) roughness of less than about 10 atomic layers, or less than about 3 nm.

6. The method of claim 1, wherein after removing the patterned mask each sidewall of the target layer comprises a one sigma root-mean-square (RMS) roughness of less than about 3 atomic layers, or less than about 1 nm.

7. The method of claim 1, wherein removing the patterned mask comprises an etch selective to the target layer.

8. A method for forming a semiconductor device, the method comprising:
    forming a sacrificial layer on a substrate;
    forming a patterned mask by removing portions of the sacrificial layer to expose a surface of the substrate;
    smoothing sidewalls of the patterned mask;
    forming a semiconductor layer over the patterned mask and the substrate;
    forming a semiconductor fin by removing portions of the semiconductor layer to expose a surface of the patterned mask;
    removing the patterned mask; and
    forming a gate over a channel region of the semiconductor fin.

9. The method of claim 8, wherein smoothing sidewalls of the patterned mask comprises a high temperature furnace annealing or a hot mold embossing process at a temperature of greater than about 500 degrees Celsius.

10. The method of claim 8, wherein a sidewall angle of the semiconductor fin after removing the patterned mask is greater than about 90 degrees as measured from a top surface of the semiconductor fin.

11. The method of claim 8, wherein after removing the patterned mask each sidewall of the semiconductor fin comprises a one sigma root-mean-square (RMS) roughness of less than about 10 atomic layers, or less than about 3 nm.

12. The method of claim 8, wherein after removing the patterned mask each sidewall of the semiconductor fin comprises a one sigma root-mean-square (RMS) roughness of less than about 3 atomic layers, or less than about 1 nm.

13. The method of claim 8, wherein removing the patterned mask comprises an etch selective to the semiconductor fin.

14. The method of claim 8, wherein the semiconductor fin comprises silicon germanium (SiGe).

15. The method of claim 14 further comprising forming a doped region on the semiconductor fin and adjacent to the gate; wherein the doped region comprises p-type dopants selected from the group consisting of gallium (Ga), boron (B), difluoroboron (BF2), and aluminum (Al).

\* \* \* \* \*